United States Patent [19]

Arrathoon

[11] Patent Number: 5,111,414
[45] Date of Patent: May 5, 1992

[54] METHOD AND APPARATUS FOR TRUTH TABLE BASED NONCONTENDING OPTICAL CROSSBAR SWITCH

[76] Inventor: Raymond Arrathoon, 1409 Chestnut La., Rochester Hills, Mich. 48063

[21] Appl. No.: 597,116

[22] Filed: Oct. 15, 1990

Related U.S. Application Data

[63] Continuation of Ser. No. 231,718, Aug. 12, 1988, abandoned, which is a continuation-in-part of Ser. No. 912,353, Sep. 26, 1986, Pat. No. 4,821,222.

[51] Int. Cl.⁵ .............................................. G06F 1/04
[52] U.S. Cl. ................................................... 364/713
[58] Field of Search ................... 364/713, 715.01, 822, 364/845

[56] References Cited

U.S. PATENT DOCUMENTS

| | | | |
|---|---|---|---|
| 3,680,080 | 7/1972 | Maure | 364/713 X |
| 4,418,394 | 11/1983 | Tai | 364/713 X |
| 4,569,033 | 2/1986 | Collins et al. | 364/845 |
| 4,607,344 | 8/1986 | Athale et al. | 364/845 X |
| 4,620,293 | 10/1986 | Schlunt et al. | 364/845 |
| 4,809,204 | 2/1989 | Dagenais et al. | 364/713 |
| 4,821,222 | 4/1989 | Arrathoon | 364/713 |

OTHER PUBLICATIONS

Bigbie et al, "Optical Programmed Logic Array", IBM Tech. Disclosure Bulletin, vol. 20, No. 8, Jan. 1978, pp. 2960-2961.
Sawchuk et al., "Digital Optical Computing," Proceedings of the IEEE, 72, pp. 758-779 (Jul., 1984).
Sasao, "On the Optimal Design of Multiple-Valued PLA's," Proceedings of the Sixteenth International Symposium on Multiple-Valued Logic, pp. 214-223 (1984).
McAulay, "Optical Crossbar Interconnected Digital Signal Processor with Basic Algorithms," Optical Engineering, 25, pp. 82-90 (Jan. 1986).
Huang, et al., "Optical Computation Using Residue Arithmetic," Applied Optics, 18, pp. 149-162 (Jan. 1979).
Gaylord et al., "Optical Digital Truth Table Look-Up Processing," Optical Engineering, 25 pp. 48-58 (Jan. 1986).
Arrathoon et al., "Shadow Casting for Multiple-Valued Associative Logic," Optical Engineering, 25, pp. 29-37 (Jan. 1986).
Arrathoon et al., "Integrated Optical Combinatorial Logic Using Electrooptic Bragg Gratings," Proceedings of the Soc. of Photo-Optical Instrumentation Engineers, 578, pp. 207-213 (Sep. 1985).
Guilfoyle et al., "Combinatorial Logic Based Optical Computing," Proceedings of the Society of Photo-Optical Instrumentation Engineers, 639, pp. 102-110 (Apr. 1986).
Farhat and Psaltis, "Optical Implementations of the Hopfield Model," 4-page article (no date or publication given).
Sasao & Terada, "Multiple-Valued Logic & The Design of Programmable Logic Arrays With Decoders," Proceedings of the Ninth International Symposium on Multi-Valued Logic, pp. 27-37 (1979).

(List continued on next page.)

*Primary Examiner*—Tan V. Mai
*Attorney, Agent, or Firm*—Harness, Dickey & Pierce

[57] ABSTRACT

Arrangement and methods for the design of a hybrid optical/electronic system that implements a truth table based noncontending N×M or N×M crossbar switch with bit-slice reconfigurability. The hybrid optical/electronic architecture for implementing the switch contains one or more sets of emitters a cross connection array with embedded logic, and one or more sets of detectors. Four basic variations of the architecture are described that effect the same basic truth table. The first variation employs direct fiber connections within the cross connection array. The second variation employs embedded programmable logic devices within the cross connection array. The third and fourth variations each employ embedded multiplexers within the cross connection array, with the fourth variation having memory elements that enable the crossbar switch to operate synchronously.

21 Claims, 7 Drawing Sheets

OTHER PUBLICATIONS

Psaltis & Farhat, "Optical Information Processing Based on an Associative Memory Model of Neural Nets With Thresholding and Feedback," *Optics Letters*, vol. 10, No. 2, pp. 98–100 (Feb. 1985).

Sawchuk et al., "Optical Crossbar Networks," IEE *Computer Magazine*, vol. 20, No. 6, pp. 50–60 (Jun. 1987).

Robinson, "Overview of Programmable Hardware," *Byte Magazine*, vol. 12, No. 1, pp. 197–203 (Jan. 1987).

Arrathoon, "Reconfigurable Fiber Optics and Generalized Crossbar Switches," *Society of Photo-Optical Instrumentation Engineers*, vol. 835, pp. 338–345 (Aug. 16, 1987).

| | | | | | | | | | | | | | | | | |
|---|---|---|---|---|---|---|---|---|---|---|---|---|---|---|---|---|
| | | M × Log₂N Control Bits 12 | | | | | | | N = 4 Data Bits 13 | | | | M = 4 Output Functions 14 | | | |
| $C_1$ | $C_2$ | $C_3$ | $C_4$ | $C_5$ | $C_6$ | $C_7$ | $C_8$ | $X_1$ | $X_2$ | $X_3$ | $X_4$ | $Y_1$ | $Y_2$ | $Y_3$ | $Y_4$ | |
| – | – | – | – | – | – | 0 | 0 | 1 | – | – | – | 1 | 0 | 0 | 0 | ⎫ |
| – | – | – | – | – | – | 0 | 1 | – | 1 | – | – | 1 | 0 | 0 | 0 | ⎬ N = 4 Product Terms |
| – | – | – | – | – | – | 1 | 0 | – | – | 1 | – | 1 | 0 | 0 | 0 | |
| – | – | – | – | – | – | 1 | 1 | – | – | – | 1 | 1 | 0 | 0 | 0 | ⎭ |
| – | – | – | – | 0 | 0 | – | – | 1 | – | – | – | 0 | 1 | 0 | 0 | ⎫ |
| – | – | – | – | 0 | 1 | – | – | – | 1 | – | – | 0 | 1 | 0 | 0 | ⎬ N = 4 Product Terms |
| – | – | – | – | 1 | 0 | – | – | – | – | 1 | – | 0 | 1 | 0 | 0 | |
| – | – | – | – | 1 | 1 | – | – | – | – | – | 1 | 0 | 1 | 0 | 0 | ⎭ |
| – | – | 0 | 0 | – | – | – | – | 1 | – | – | – | 0 | 0 | 1 | 0 | ⎫ |
| – | – | 0 | 1 | – | – | – | – | – | 1 | – | – | 0 | 0 | 1 | 0 | ⎬ N = 4 Product Terms |
| – | – | 1 | 0 | – | – | – | – | – | – | 1 | – | 0 | 0 | 1 | 0 | |
| – | – | 1 | 1 | – | – | – | – | – | – | – | 1 | 0 | 0 | 1 | 0 | ⎭ |
| 0 | 0 | – | – | – | – | – | – | 1 | – | – | – | 0 | 0 | 0 | 1 | ⎫ |
| 0 | 1 | – | – | – | – | – | – | – | 1 | – | – | 0 | 0 | 0 | 1 | ⎬ N = 4 Product Terms |
| 1 | 0 | – | – | – | – | – | – | – | – | 1 | – | 0 | 0 | 0 | 1 | |
| 1 | 1 | – | – | – | – | – | – | – | – | – | 1 | 0 | 0 | 0 | 1 | ⎭ |

FIG. 1.

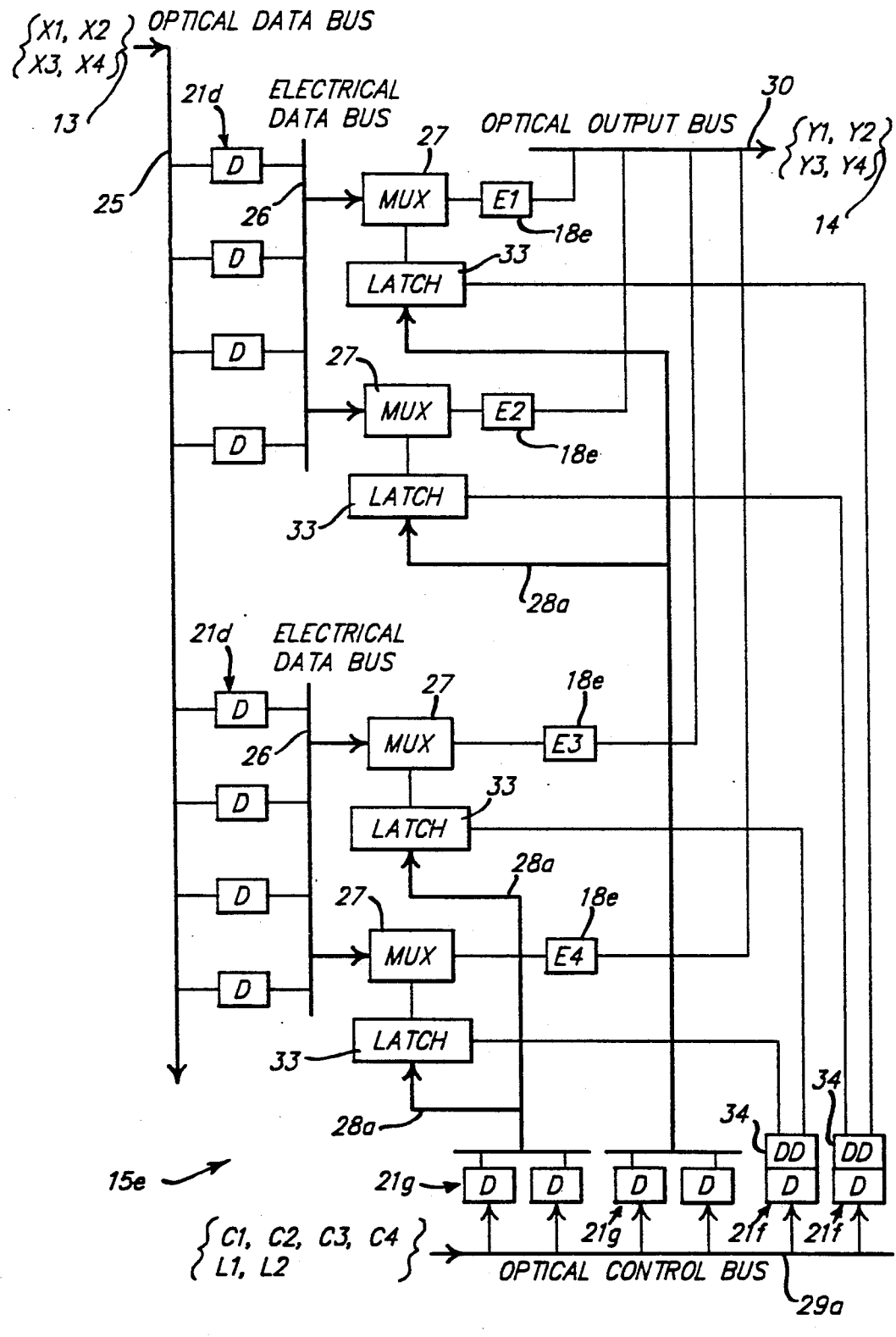

METHOD AND APPARATUS FOR TRUTH TABLE BASED NONCONTENDING OPTICAL CROSSBAR SWITCH

This is a continuation of U.S. patent application Ser. No. 07/231,718, filed Aug. 12, 1988, abandoned which is a continuation in part of my co-pending patent application Ser. No. 912,353, filed Sep. 26, 1986, and entitled "Method and Apparatus for Programmable Optical Crossbar Logic Array with Decoders", U.S. Pat. No. 4,821,222, and which is hereby incorporated herein by reference.

BACKGROUND OF THE INVENTION

1. Field of Invention

This invention relates generally to an optical logic based computing method or process and to devices and systems for practicing such methods. More particularly this invention relates to truth table based hybrid optical/electronic methods and arrangements for implementing a noncontending crossbar switch with bit-slice reconfigurability.

2. Description of Related Art

Reference may be had to a paper by A. A. Sawchuk, B. K. Jenkins, and C. S. Raghavendra entitled "Optical Crossbar Networks," *IEEE Computer* Magazine, vol. 20, No. 6, pp 50-60 (Jun. 1987) for general background information pertaining to $N \times N$ optical cross bar networks. The paper reviews six standard methods for implementing an $N \times N$ optical crossbar switching that is capable of connecting any of N data inputs to any of all of N output without contention. This paper also compares optical crossbar switches to electronic crossbar switches and points out that the six standard optical implementations are capable of relatively high data rates and relatively slow reconfiguration rates, while electronic crossbar switches are capable of somewhat slower data rates and somewhat higher reconfiguration rates. It is worth noticing that none of the electronic crossbar switches use optical fan-out from the input data lines. Also, none of the six optical techniques are based on implementation specifying N input data bits, $(\log_2 N) \times M$ input control bits, and M output bits in the form of a truth table or logic array. It would be advantageous if a truth table based optical crossbar switch could be devised since such a switch would be seemingly capable of achieving both high data rates and high reconfiguration rates.

General background information with respect to the state of the art in electronic programmable logic arrays is provided in a paper by P. Robinson entitled "Overview of Programmable Hardware," *Byte* Magazine, vol. 12, No. 1 Jan. 1987).

Optical crossbar structures for effecting a fiber optic based version of a programmable logic array are disclosed in my above-cited co-pending patent application Ser. No. 912,353. It also disclosed hybrid optical/electronic methods for implementing a programmable logic array. The present invention extends and refines these concepts to permit the construction of an optical crossbar switch.

The use of truth tables to effect both high data rate and high reconfiguration rate noncontending optical crossbar switches is described in my paper entitled "Reconfigurable Fiber Optics and Generalized Crossbar Switches," *Society of Photo-Optical Instrumentation Engineers*, vol. 835, pp. 338-345 (Aug. 16, 1987). which is hereby incorporated by reference herein. This paper outlines the mathematical and logical basis for such optical crossbar switches but does not describe methods or structures for implementing same. The work described in the paper was supported, in part, by the Defense Advanced Research Projects Agency (DARPA). which has encouraged the development of improved varieties of optical crossbar switches.

To the best of my knowledge, all previous optical crossbar systems suffer from one or more important deficiencies which prevents them from achieving the theoretical advantages described in my above-cited paper. Either they do not specify N input data bits, $(\log_2 N) \times M$ input control bits, and M output bits in the form of a truth table or logic array, or they do not include optical fan-out from the input data lines or they are incapable of bit-slice reconfigurability. Here bit-slice reconfigurability is defines as the ability of the crossbar switch to reconfigure its data input-output switch settings in a period that is equal to one or a relatively small number of input data bit intervals. The advantages of bit-slice reconfigurability in a crossbar switch includes high reconfiguration rates, the ability to transfer both small and large blocks of data, an increase in the effective data rate, a potential increase in the efficiency of processor level communications, and the possible use of a crossbar switch as a computational component. Thus, it would be highly desirable if one or more methods and systems could be found for implementing a globally connected optical crossbar structure with optical fan-out from the input data lines which forms an integral part of a truth table based hybrid optical/electronic crossbar switch capable of bit-slice reconfigurability.

The primary object of this invention is to provide a method and apparatus for a hybrid optical/electronic noncontending $N \times M$ crossbar that overcomes many of the restrictions of existing crossbar switches in terms of being able to achieve both high data rates and high reconfiguration rates.

An important object of the present invention is to achieve the abovestated primary object by providing a method and apparatus for implementing a truth table based hybrid optical/electronic noncontending $N \times M$ crossbar switch with bit-slice reconfigurability.

An other object of this invention is to provide a method and apparatus for a generalized structure that is capable of implementing a truth table based hybrid optical/electronic noncontending $N \times M$ crossbar switch with bit-slice reconfigurability.

Yet another object is to provide a method and apparatus for a truth table based hybrid optical/electronic asynchronous noncontending $N \times M$ crossbar switch that is effected by optoelectronic means through the sequence INVERT-OR-INVERT-OR.

One more object of this invention is to provide a method and apparatus for a truth table based hybrid optical/electronic asynchronous noncontending $N \times M$ crossbar switch that is effected by a combination of optoelectronic means and programmable logic devices.

Still another object is to provide a method and apparatus for a truth table based hybrid optical/electronic asynchronous noncontending $N \times M$ crossbar switch that is effected by a combination of optoelectronic means and multiplexers.

An additional object is to provide a method and apparatus for a truth table based hybrid optical/electronic synchronous noncontending $N \times M$ crossbar switch that is effected by a combination optoelectronic means, multiplexers, and memory elements.

SUMMARY OF THE INVENTION

In light of the foregoing objects, there are provided, according to the present invention, several methods and apparatuses for implementing a truth table based hybrid optical/electronic noncontending N×M crossbar switch with bit-slice reconfigurability.

A first method and apparatus of the present invention, the logic for an asynchronous noncontending N×M crossbar switch with N optically coupled input data lines and M optically coupled output lines may be described in terms of a simple truth table in which the truth table inputs consist of N input data bits and $(\log_2 N) \times M$ input control bits. The truth table itself may be defined in terms of N×M product terms that are divided into M groups, each consisting of N unity output terms, with each of the groups corresponding to one of the M output lines. When the entire table is implemented with hybrid optical/electronic combinational logic elements, said table may be effected in a fully parallel manner to provide asynchronous control and data operation. Alternately, if the table is implemented with both combinational logic and memory elements, the table may be divided into segments, but synchronous control and data operation will be required.

In a first embodiment of this invention, a series of semiconductor lasers or light emitting diodes are spatially positioned along a row array. The input optical signal from each emitting element of the row array is fanned-out in a fiber-coupled globally connected crossbar arrangement to each column of a generalized fiber-coupled cross connection array. This generalized cross connection array includes fiber-coupled optical input detectors and fiber-coupled optical output emitters. The generalized cross connection array may also include logic operations between the input detector and output emitter assembly. One of the principal advantages of the embedded logic within the generalized cross connection array is the ability to mix and merge electronic fan-out factors, electronic fan-in factors and electronic logic with the incoming and outgoing optical signals. A second set of optical signals is preferably provided to the generalized cross connection array by a column array of fiber-coupled semiconductor laser or light emitting diodes. The optical signal from each element of the second input array is fanned-out in an orthogonal manner to the fan-out pattern of the first input array. The outputs from this group of emitters are then fiber-coupled to each row of the generalized cross connection array. The output of the generalized cross connection array itself is fiber-coupled to a column array of optical detectors in a standard optical crossbar geometry wherein each row output of the generalized cross connection array is fanned-in to each element of the detector column array. As will be more fully appreciated from the detailed description below, the entire system thus constitutes a generalized structure that is capable of implementing a truth table based noncontending hybrid optical/electronic N×M crossbar switch which is bit-slice reconfigurable.

In a second embodiment of this invention, the truth table previously described in this section of an N×M noncontending optical crossbar switch with bit-slice reconfigurability is effected according to the sequence INVERT-OR-INVERT-OR in accordance with the procedure described in my earlier co-pending patent application, Ser. No. 912,353. The truth table may be effected with the procedures described in that patent application or may be similarly effected with the generalized structure described earlier in this section by requiring that only the first set of orthogonal inputs of the generalized structure be active, by including electrical decoders before the first stage of orthogonal inputs, by including an additional stage of inverting emitters that are directly connected to each element of the column array of the output detectors, and by fanning-in the optical outputs from one or more of these final emitters to a final column array of detectors. The first set of orthogonal inputs, consisting of decoded data and control bits, drive a set of inverting emitters that are fiber-coupled to the generalized cross connection array in a standard crossbar structure. In this approach, the first INVERT in the sequence INVERT-OR-INVERT-OR is effected in parallel by the inverting emitters. Here, the generalized cross connection array consists solely of a direct fiber connection in a standard crossbar geometry. The first OR in the sequence INVERT-OR-INVERT-OR is effected in parallel by detection and thresholding elements in the output detector array. The second INVERT in the sequence INVERT-OR-INVERT-OR is effected by the second set of inverting emitters, while the final OR is effected in the final set of detection and thresholding elements. This mode of operation is asynchronous.

In the third embodiment of this invention, the generalized structure described earlier in this section is employed with both sets of orthogonal inputs in an active mode. The first set of inputs, consisting only of data bits, are fanned-out to the fiber-coupled generalized cross connection network as described earlier. The second set of inputs, consisting only of control buts, are fanned-out to the generalized cross connection network in an orthogonal direction to the first set of inputs. Detection and thresholding elements in the generalized cross connection network are then connected in parallel to an array of programmable logic devices that perform local logic operations within the generalized connection network. This mode of operation is asynchronous. The outputs of the programmable logic devices are connected to the fiber-coupled output of the generalized connection array. The optical output signals are then fanned-in, detected and thresholded at the output detector array.

In a fourth embodiment of this invention, the generalized structure described earlier is employed with only the first set of orthogonal inputs in an active mode. The first set of inputs, consisting of both data and control bits, are fanned-out to the generalized cross connection network as described earlier. Detection and thresholding elements in the generalized cross connection network are then connected to an array of multiplexers that operate in parallel within the generalized connection network. This mode of operation is asynchronous. The output of each multiplexer is connected to the fiber-coupled output of the generalized connection array. The optical output signals are then directly connected to the output detector array, where they are detected and thresholded.

In the fifth embodiment of this invention, the generalized structure described earlier is employed with only the first set of orthogonal inputs in an active mode. The first set of inputs, consisting of both data and control bits, are fanned-out to the generalized cross connection network as described earlier. Detection and thresholding elements in the generalized cross connection network are then connected to an array of multiplexers that are latched in a sequential manner within the generalized connection network. This mode of operation necessitates synchronous operation. The output of each multiplexer is connected to the fiber-coupled output of the generalized connection array. The optical output signals are then directly connected to the output detector array, where they are detected and thresholded.

These and other aspects, objects and advantages of the present invention will be more fully understood by reference to the detailed description which follows, taken in conjunction with the various figures and appended claims.

BRIEF DESCRIPTION OF THE DRAWINGS

The drawings form an integral part of the description of the preferred embodiments and are to be read in conjunction therewith. Like reference numerals designate identical components in the different Figures, where:

FIG. 1 depicts a binary truth table for a noncontending 4×4 crossbar switch with bit-slice reconfigurability illustrating the procedure for developing a truth table defined an N×M crossbar switch with bit-slice reconfigurability that may be employed in practicing this invention;

FIG. 7 depicts a specific example of a multiplexer and latch based synchronous 4×4 crossbar switch with bit-slice reconfigurability that is effected in accordance with the architecture of FIG. 2.

DETAILED DESCRIPTION OF THE PREFERRED EMBODIMENT

Prior to discussing specific preferred embodiments of the present invention, it is useful to discuss the truth table 11 shown in FIG. 1, which provides a mathematical or logical foundation for the methods and apparatuses described thereafter and illustrated in the subsequent Figures.

In the FIG. 1 table, input control variables C1, C2, C3, C4, C5, C6, C7, and C8, indicated generally by the numbers 12, and input data variables X1, X2, X3 and X4, indicated generally by the numeral 13 are represented in a truth table format that defines four output functions Y1, Y2, Y3, Y4 indicated generally by the numeral 14. This truth table defines the logic for a fully parallel noncontending 4×4 crossbar switch in which any of the data inputs may be connected to any or all of the outputs. More generally, the table indicates that with N input data bits and M×log$_2$N input control bits, N×M product terms are generated that may be divided into M groups, each consisting of N unity output terms, while each group corresponding to one of the M output lines. When the entire table is implemented with hybrid optical/electronic combinational logic elements, the table may be effected in a fully parallel manner to provide asynchronous control and data operation. Alternately, if the table is implemented with both combinational logic and memory elements, the table may be divided into segments, but synchronous control and data operation will be required. Mathematically, the table is equivalent to a noncontending 4×4 crossbar switch in which the control variables C1, C2, C3, C4, C5, C6, C7 and C8 determine the switch connection pattern. By resetting the switch connection pattern after one or more bit cycles of data bits X1, X2, X3 and X4 are routed through the switch, the switch may be operated in a manner that is bit-slice reconfigurable. This approach is potentially capable of realizing reconfiguration rates that are comparable to input data rates.

Figure 2:
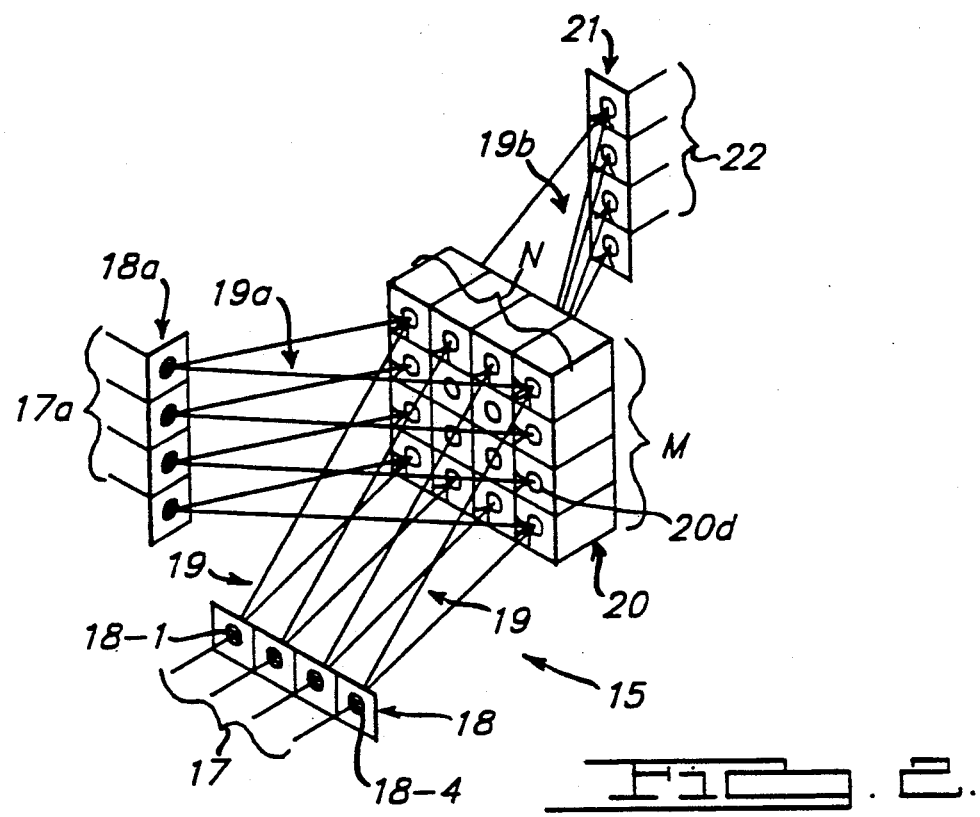
FIG. 2 depicts a generalized architecture that may be employed in implementing truth tables of the form shown in FIG. 1.

FIG. 2 shows a generalized architecture or system 15 that may be employed in implementing truth tables of the form shown in FIG. 1. One set of electrical inputs generally indicated by the numeral 17 drives a set of optical emitters consisting of a linear array of lasers or light emitting diodes that are generally indicated by the numeral 18. The fiber coupled outputs from these emitters 18 are fanned-out as optical fiber interconnects generally indicated by the numeral 19 to a generalized cross connection array 20 that contains fiber coupled detectors, internal logic, and fiber coupled emitters. As is clearly shown, array 20 is constructed to receive optical inputs in a two-dimensional or "row and column" format, and for each optical input selectively produced an optical output in accordance with the internal logic associated with such input. As those in the art should readily appreciate, one of the principal advantages of the embedded logic within the generalized cross connection array 20 is the ability to mix and merge electronic fan-out factors, electronic fan-in factors and electronic logic with the incoming and outgoing optical signals.

A second set of electrical inputs indicated by the alphanumeric symbol 17a drives a second set of optical emitters consisting of a linear array of lasers or light emitting diodes that are generally indicated by the alphanumeric symbol 18a. The fiber coupled outputs from these emitters 18a are fanned-out as optical fiber interconnects generally indicated by the reference symbol 19a to the generalized cross connection array 20 in a manner that is orthogonal to the first set of optical fiber interconnects 19. The output of the cross connection array 20 is fanned-in via optical fiber interconnected generally indicated by the alphanumeric symbol 19b to a linear array of optical thresholding detectors generally indicated by the numeral 21. The detectors provide electrical outputs 22. The entire system 15 constitutes a generalized architecture that is capable of implementing a truth table based noncontending hybrid optical/electronic N×M crossbar switch that is bit-slice reconfigurable. Those in the art will readily appreciate that the various parts 17 through 21 of the system 15 may be constructed using any conventional or suitable components, as will be further explained below.

Figure 3:
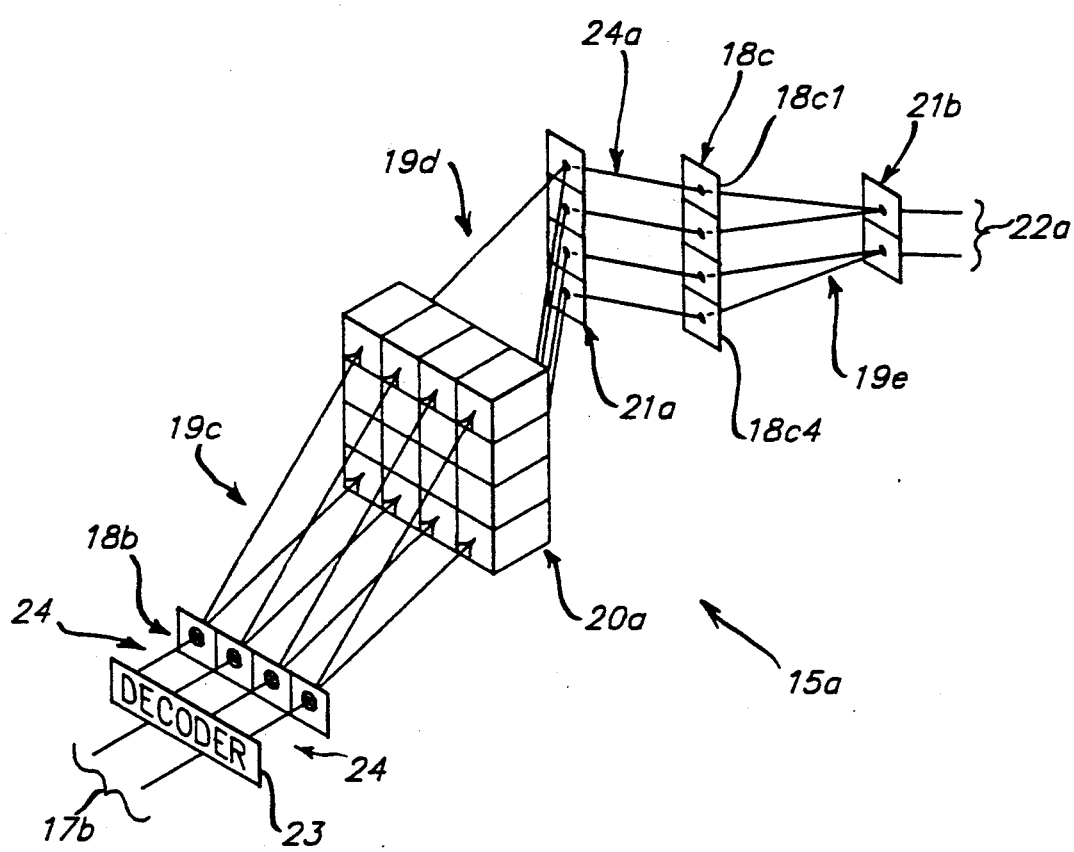
FIG. 3 depicts an extension of the generalized architecture of FIG. 2 that permits all of the logical OR operations in the sequence INVERT-OR-INVERT-OR to be effected optoelectronically.

FIG. 3 shows a second system 15a which is a variation and extension of the generalized architecture illustrated in FIG. 2. The purpose of this extension is to implement the logical sequence INVERT-OR-INVERT-OR in a manner that eliminates the need to include internal logic within the generalized cross connection array 20 depicted in FIG. 2. Referring to FIG. 3, electrical inputs generally indicated by the alphanumeric symbol 17b enter one or more electrical decoders generally indicated by the numeral 23. The decoder electrical output lines are generally indicated by the numeral 24 and are connected to a fiber coupled inverting emitter array 18b which accepts the electrical inputs on lines 24, individually inverts them, and generates optical signals respectively corresponding to the inverted signals. The first INVERT in the logical sequence INVERT-OR-INVERT-OR is effected by the inverting emitters 18b. The fiber coupled outputs from emitters 18b are fanned-out as optical fiber interconnects generally indicated by the alphanumeric symbol 19c to a generalized cross connection array 20a. The sole function of the generalized cross connection array 20a in system 15a is to provide a direct fiber connection between input optical fiber interconnects 19c and output optical fiber interconnects generally indicated by the alphanumeric symbol 19d. The optical fiber interconnects 19d are fanned-in to a fiber coupled thresholding detector array 21a. The detector array 21a effects the first OR in the logical sequence INVERT-OR-INVERT-OR. The electrical output lines 24a of detector array 21a are connected to an array 18c of inverting emitters 18c1 through 18c4 which each receive an electrical input from a respective one of the lines 24a, inverts this electrical signal and then generates and emits a corresponding optical input signal. The optical outputs from inverting emitters 18c are fanned-in via optical fiber interconnects 19e to an array 21b of optical thresholding detectors. The detector array 21b effects the final OR operation in the sequence INVERT-OR-INVERT-OR and provides electrical outputs generally indicated by the alphanumeric symbol 22a. This architecture effects a generalized INVERT-OR-INVERT-OR sequence and is capable of implementing a truth table base noncontending hybrid optical/electrical N×M crossbar switch that is bit-slice reconfigurable.

Figure 4:
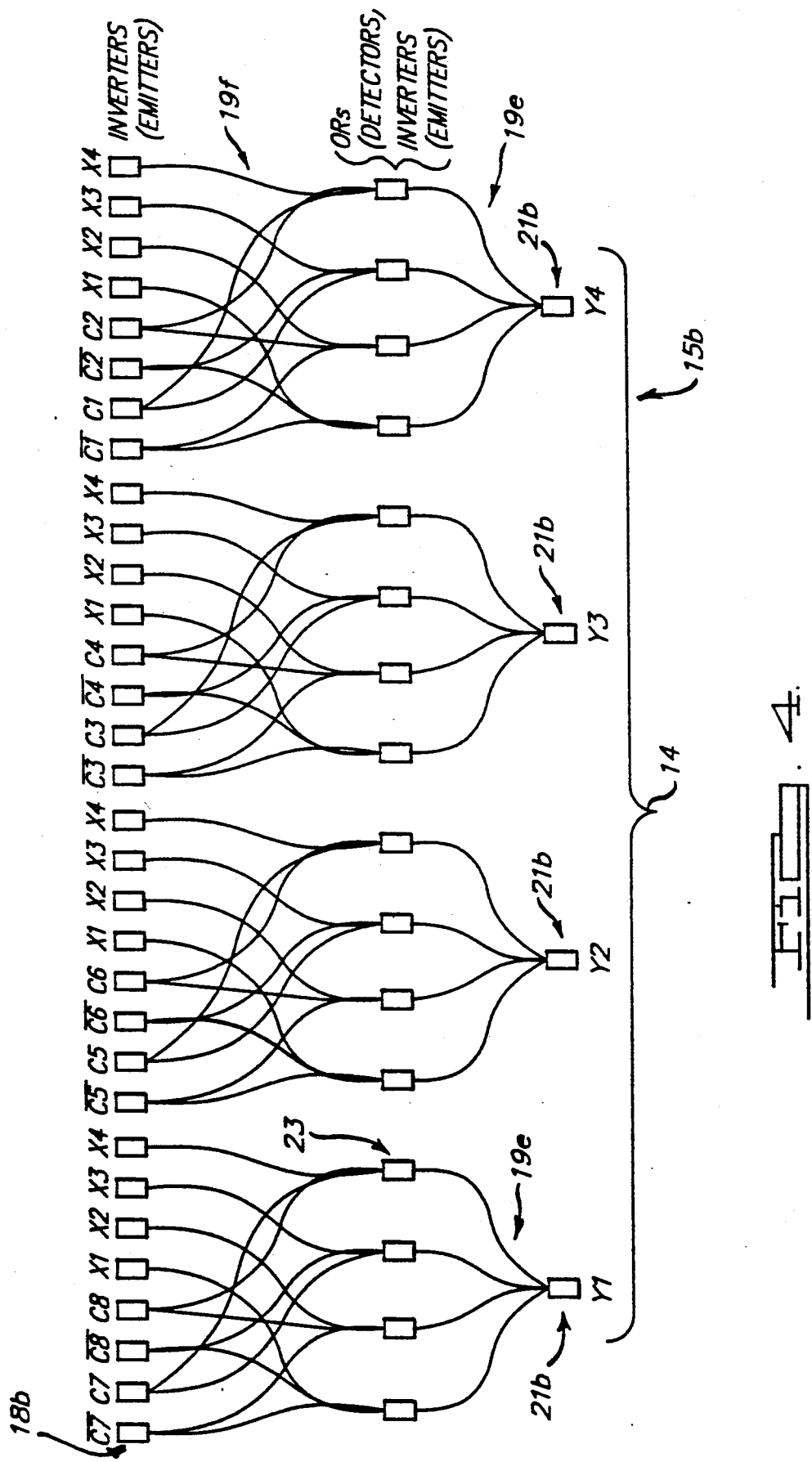
FIG. 4 depicts a specific example of an asynchronous 4×4 crossbar switch with bit-slice reconfigurability that is effected in accordance with the architecture of FIG. 3.

The INVERT-OR-INVERT-OR architecture in system 15a of FIG. 3 is specifically applicable to the truth table of FIG. 1 to effect a 4×4 noncontending crossbar switch 15b with bit-slice reconfigurability as depicted in FIG. 4. For purposes of clarity, some of the details of FIG. 3 are omitted from the schematic illustration of FIG. 4. In FIG. 4, the input control variables are indicated by the reference symbols C1, C2, C3, C4, C5, C6, C7 and C8, and their complements are respectively indicated by the same symbols with conventional bars thereover. Input data variables are indicated by the reference symbols X1, X2, X3 and X4. Inverting emitters 18b are directly fiber coupled as generally indicated by the symbol 19f to detector/emitter array 23. Fiber interconnects 19f may be thought of as a direct connection of fiber interconnects 19c and 19d together, without the cross connection array 20a being disposed therebetween. The detector/emitter array 23 may be thought of as a replacement for detectors 21a, electrical interconnects 24a and emitters 18c shown in FIG. 3. The outputs of the detector/emitter array 23 are fanned-in via optical fiber interconnects 19e to detector array 21b. The overall operation of the crossbar switch 15c having the topology shown in FIG. 4 is to implement the functions Y1, Y2, Y3 and Y4 as indicated in truth table 11 shown in FIG. 1. This mode of operation is asynchronous.

Figure 5:
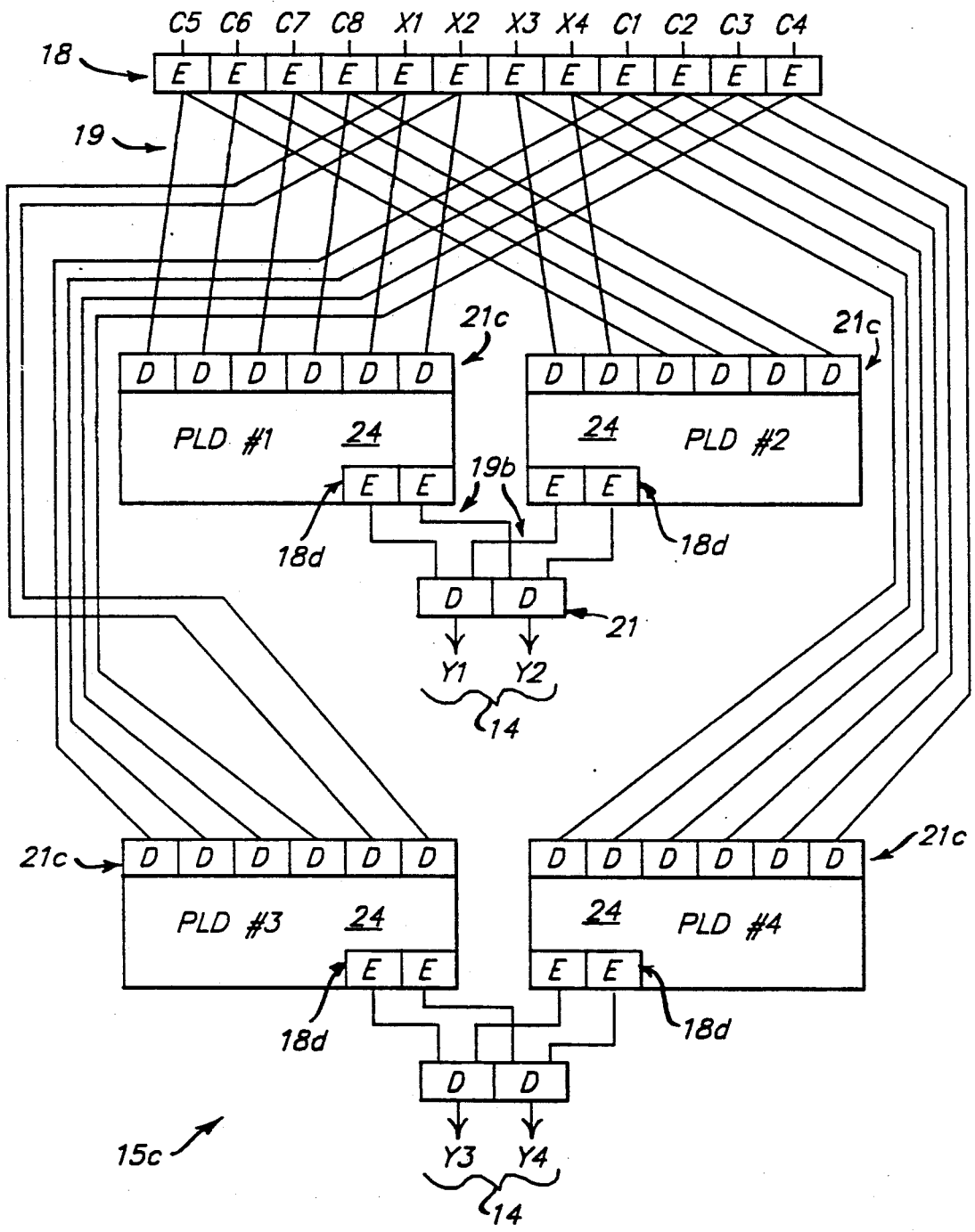
FIG. 5 depicts a specific example of a programmable logic device based asynchronous 4×4 crossbar switch with bit-slice reconfigurability that is effected in accordance with the architecture of FIG. 2.

The generalized architecture of FIG. 2 may also specifically be applied to the truth table 11 of FIG. 1 to effect a programmable logic device based 4×4 noncontending crossbar switch 15c with bit-slice reconfigurability as depicted in FIG. 5. For purposes of clarity, some of the details of FIG. 2 are omitted from the schematic illustration of FIG. 5. Again, the input control variables are indicated by reference symbols C1, C2, C3, C4, C5, C6, C7 and C8, and input data variables are indicated by the reference symbols X1, X2, X3 and X4. Emitters 18 are fanned-out with optical fiber interconnects 19 to a group of detectors generally indicated by the alphanumeric symbol 21c. The detectors 21c are coupled to a first set of programmable logic devices (PLD1 and PLD2) generally indicated by the numeral 24. The outputs of the programmable logic devices 24 are respectively connected to dedicated sets of emitters 18d which are then fanned-in with optical fiber interconnects 19b to detector array 21. The outputs of the detector arrays 21 are four output functions Y1, Y2, Y3 and Y4 as indicated. This mode of operation is asynchronous. This programmable logic device based approach shown in FIG. 5 mixes and merges electronic fan-out factors and electronic fan-in factors with incoming and outgoing optical signals.

Figure 6:
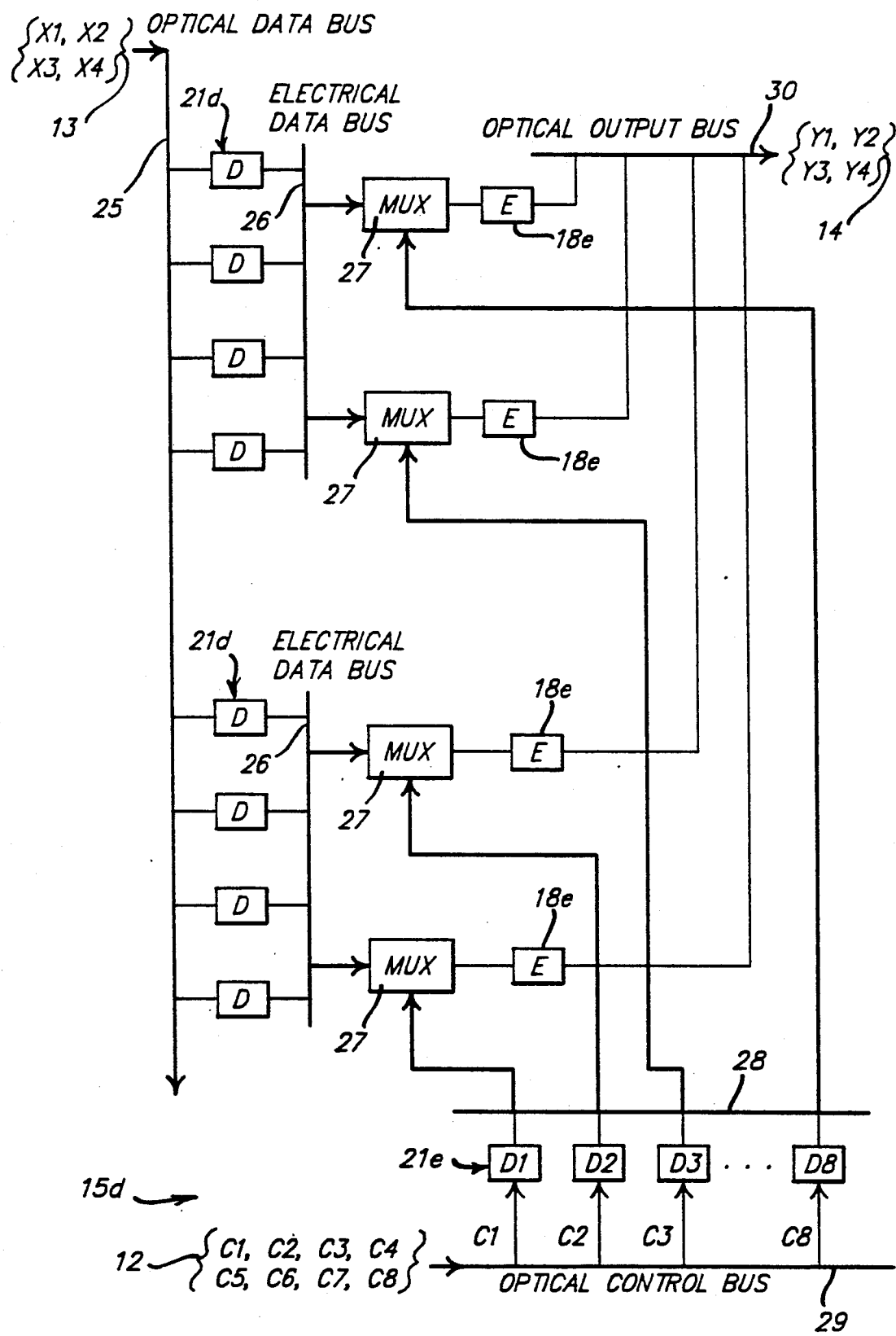
FIG. 6 depicts a specific example of a multiplexer based asynchronous 4×4 crossbar switch with bit-slice reconfigurability that is effected in accordance with the architecture of FIG. 2.

As shown in FIG. 6, the generalized architecture of FIG. 2 may be specifically applied to the truth table of FIG. 1 to effect in yet another way an asynchronous multiplexer based 4×4 noncontending crossbar switch with bit-slice reconfigurability. This additional embodiment is illustrated in FIG. 6 as crossbar switch 15d. For purposes of clarity, some of the details of the FIG. 2 structure are omitted from the schematic illustration of the switch 15d in FIG. 6. Once again, input control variables are indicated by reference symbols C1, C2, C3, C4, C5, C6, C7 and C8 and input data variables are indicated by symbols X1, X2, X3 and X4. Optical input signals X1 through X4 from a conventional or suitable optical data bus 25 are fanned-out to two sets of detectors 21d. The outputs of the two detectors 21d are respectively connected to one of two electrical data busses 26 as shown that separately fan-out the electrical signals to each of two multiplexers 27, which are of conventional construction. Control inputs to multiplexer 27 are supplied from a separate electrical control bus indicated by the numeral 28. The input to this electrical control bus 28 is supplied from a set of eight detectors 21e that are in turn supplied by optical input signals originating from an optical control bus 29. The outputs of the multiplexers 27 are individually connected to optical emitters 18e. The emitters 18e then drive an optical output bus 30 to provide the desired four output functions Y1, Y2, Y3 and Y4. This mode of operation is fully parallel and is asynchronous. The multiplexers 27 in effect provide all of the required fan-in factors and eliminate the need for optical fan-in. The fan-out factor provided by the electrical data bus also reduces the optical fan-out requirements that would otherwise be necessary. Mixing and merging electronic fan-out factors and electronic fan-in factors with incoming and outgoing optical signals essentially reduces the total number of optoelectronic emitters and detectors, thereby lowering the overall cost of the crossbar switch 15d substantially.

As shown in FIG. 7, the generalized architecture of FIG. 2 may also be specifically applied to the truth table of FIG. 1 to effect a synchronous multiplexer based 4×4 noncontending crossbar switch 15e with bit-slice reconfigurability. For purposes of clarity, some of the details of FIG. 2 are omitted from the schematic illustration of crossbar switch 15e in FIG. 7. Input control variables are indicated by symbols C1, C2, C3, C4, L1 and L2 and input data variables are indicated by symbols X1, X2, X3 and X4. Optical input signals X1 through X4 from an optical data bus 25 are fanned-out to two sets of detectors 21d. The electrical outputs of detectors 21d are respectively connected to two electrical data busses 26 that separately fan-out the electrical signals to each of two multiplexers 27. Control inputs to each set of two multiplexers 27 are supplied from two pairs of latches 33 that are in turn supplied from one of two separate electrical control busses 28a. Each of the two pairs of latches 33 is enabled sequentially by use of a decoder 34 that is activated sequentially by an electrical input supplied from a detector generally indicated by the alphanumeric symbol 21f. The detector 21f in turn is supplied by optical signals L1 and L2 originating sequentially from an optical control bus 29a. The input to the two electrical control busses 28a is supplied from a set of four detectors 21g that are in turn supplied by optical input signals C1 through C4 originating from an optical control bus 29a. The electrical outputs of the multiplexers 27 are individually connected to optical emitters 18e. the emitters 18e then drive an optical output bus 30 to provide the desired four output functions Y1, Y2, Y3 and Y4. The multiplexers 27 in effect provide all of the required fan-in factors and eliminate the need for optical fan-in. The fan-out factor provided by the electrical data bus also reduces the optical fan-out requirements that would otherwise be necessary. The foregoing addition of combinational logic, shown in the form of decoders 34, and the addition of memory elements, shown in the form of latches 33, to the previous implementation of FIG. 6 thus permits sequential activation of the multiplexers 27, thereby reducing the total number of control bits, detectors, and system cost at the expense of reconfiguration time. This mode of operation necessitates synchronous operation. As before, mixing and merging electronic fan-out factors and electronic fan-in factors with incoming and outgoing optical signals reduces the total number of optoelectronic emitters and detectors and again lowers the overall cost of the crossbar switch.

The various embodiments depicted in FIGS. 4, 5, 6 and 7 demonstrate methods and apparatuses for a variety of truth table based hybrid optical/electronic noncontending N×M crossbar switches with bit-slice reconfigurability that overcome many of the restrictions of previous crossbar switches in terms of being able to achieve both high data rates and high reconfiguration rates.

It is recognized, of course, that those skilled in the art may make various modifications or additions to the preferred embodiments chosen to illustrate the invention without departing from the spirit and scope of the present contribution to the art. For example, although the noncontending N×M crossbar switches described and shown herein have M=4 and N=4, any one skilled in the art will readily appreciate that M and/or N can have other values as well, such as 8, 16, 32, or more (or any numbers in between), with a suitable increase in the hardware needed for such larger implementations. Of course, the value of M need not be equal to the value of N, although in many applications it will be. Also, corrrelative terms such as "x" and "y", "row" and "column", "vertical" and "horizontal", "left" and "right", and the like are used herein to make the description and/or claims more readily understandable, and not meant to limit the scope of the invention. In this regard, those skilled in the art will readily appreciate such terms are often merely a matter of perspective, and are interchangeable merely by altering one's perspective, e.g., rows become columns and vise versa when one's view is rotated 90 degrees. Accordingly, it is to be understood that the protection sought out to be afforded hereby should be deemed to extend to the subject matter claimed and all equivalents thereof fairly within the scope of the invention.

I claim:

1. A truth table based hybrid optical/electronic noncontending N×M crossbar switch apparatus, comprising:

first means for converting N binary input electrical signals to N first optical outputs, where N is a positive integer having a value of at least 2;

a cross connection array having a plurality of spatially distinct locations generally arranged in M rows and N columns, where M is a positive integer having a value of at least 2, with each such location including an optical detector for transforming a first optical input received thereby into an electronic signal, internal electronic logic and an optical emitter for transforming an internal electronic signal into an optical output, with such internal electronic logic selectably interconnecting the detector and the emitter of each such location;

fist fiber optic coupling means for interconnecting the first means to the cross connection array such that at least one of the N optical outputs is fanned-out to each of the M rows of the cross connection array; and second fiber optic coupling means for effecting a factor of N fan-in of optical signals from said cross connection array, including means for effecting M individual optical OR operations such that M output signals result.

2. A noncontending crossbar switch apparatus, as in claim 1, wherein the internal electronic logic of the cross connection array is programmable, thereby providing bit-slice reconfigurability to the apparatus.

3. A noncontending crossbar switch apparatus as in claim 2, wherein the cross-connection array includes electronic programmable logic devices.

4. A noncontending crossbar switch apparatus as in claim 1, further comprising:

electrical decoder means before the first means for converting input electrical signals to decoded input electrical signals.

5. A noncontending crossbar switch apparatus as in claim 1, further comprising:

second means for converting a plurality of M binary input electrical signals to M optical outputs; and third fiber optic coupling means for interconnecting the M optical outputs to the cross connection array such that at least one of the M optical outputs is fanned out to each of N columns of the cross connection array.

6. A truth table based hybrid optical/electronic noncontending N×M crossbar switch apparatus implemented using a logical sequence INVERT-OR-INVERT in processing signals passing therethrough, the apparatus comprising:

(a) means for converting N binary input electrical signals N optical outputs, where N is a positive integer having a value of at least 2, the means for converting N electrical signals including first means for inverting the N electrical signals;

(b) first optical fiber interconnect means for fanning out at least one of the N optical outputs M times, where M is a positive integer having a value of at least 2, such that M optical signals are produced for each such optical output so fanned out;

(c) second optical fiber interconnect means for fanning in the optical signals into M spatially distinct first locations;

(d) means, including a threshold detector array, for converting M optical signals fanned in at the first locations by the second optical fiber interconnect means to M electrical signals; and (e) means for converting the M electrical signals into M inverted optical output signals.

7. A noncontending crossbar switch apparatus as in claim 6, further comprising:

(f) third optical fiber interconnects for fanning in the M inverted optical signals to a plurality of spatially distinct second locations; and (g) means for converting the fanned-in inverted optical signals at the second locations to electrical output signals, including an array of an array of optical thresholding detectors each of which is arranged to effect an OR operation, whereby the bit-slice reconfigurability of the apparatus is implemented using a logical sequence INVERT-OR-INVERT-OR in processing signals passing therethrough.

8. A noncontending crossbar switch apparatus as in claim 7, further comprising:

(h) electrical decoder means for decoding a plurality of electrical signals to produce the N binary input electrical signals; and (i) cross connection array means for providing a direct fiber connection between the first fiber interconnect means and the second fiber interconnect means.

9. A truth table based hybrid optical/electronic noncontending crossbar switch apparatus implemented by use of programmable logic device means, the apparatus comprising:

first converter means for converting a plurality of input control and data bits to a greater number of optical input signals;

a generalized cross connection network including (1) a plurality of first detector means each being for detecting a distinct one of the optical input signals and converting it into a digital electronic input signal used internally within the cross connection array, (2) electronic means for electrically performing local logic operations within the generalized network upon such internal electronic input signals under the control of other internal electronic input signals to produce digital electronic output signals and (3) a plurality of means for producing optical output signals from the network from such digital electronic output signals; and a plurality of second detector means each being for detecting a distinct one of the optical output signals from the network.

10. A noncontending crossbar switch apparatus as in claim 9, wherein:

the means for electrically performing local logic operations includes at least one programmable logic device, thereby providing bit-slice reconfigurability of the apparatus.

11. A noncontending crossbar switch apparatus as in claim 10, wherein:

the means for performing local logic operations includes a plurality of programmable logic devices, with each programmable logic device having associated therewith at least a plurality of first detector means, and a plurality of means for producing optical output signals.

12. A noncontending crossbar switch apparatus as in claim 9, further comprising:

a plurality of first optical fiber interconnects optically connecting the first converter means to the plurality of first detector means; and a plurality of second optical fiber interconnects optically connecting the plurality of means for producing optical output signals to the plurality of second detector means.

13. A noncontending crossbar switch apparatus as in claim 12, wherein:

each of the optical input signals is fanned out through respective ones of first optical fiber interconnects to at least two of the first detector means.

14. A truth table based hybrid optical/electronic noncontending crossbar switch apparatus having bit-slice reconfigurability and implemented by use of multiplexer means, the apparatus comprising:

optical means for providing a plurality of optical input data and control signals, with at least one such signal being fanned-out to at least two distinct input signal detector locations;

a generalized cross connection network including (1) a plurality of first detector means each being for detecting one of the optical input signals and converting it to a digital electronic input signal used internally within the cross connection network, (2) electronic multiplexer means for electrically performing local switching functions upon certain electronic input signals under control of certain other electronic input signals within the generalized network to produce digital electronic output, and (3) a plurality of means for producing optical output signals from the network from such electronic output signals; and optical means for routing optical output signals produced by the cross connection network.

15. A noncontending crossbar switch apparatus as in claim 14, wherein:

the multiplexer means for performing switching functions includes at least two sets of multiplexers, with each such set having at least one multiplexer therein and with each set receiving a plurality of electronic input signals representing control information and a plurality of electronic input signals representing data.

16. A noncontending crossbar switch apparatus as in claim 15, wherein:

each multiplexer has associated therewith and electronically connected thereto one of the means for producing optical output signals.

17. A synchronously operated, truth table based hybrid optical/electronic noncontending crossbar switch apparatus having bit-slice reconfigurability, the apparatus comprising:

means for providing a plurality of optical input data and control signals, with at least one such signal being fanned-out to at least two distinct input signal detector locations;

a generalized cross connection network including (1) a plurality of detector means each being for detecting one of the optical input signals and converting it to a digital electronic input signal used internally within the cross connection network, (2) electronic multiplexer means for electrically performing local switching functions upon certain electronic input signals under control of certain other electronic input signals within the generalized network to produce digital electronic output signals, said means for performing including at least one multiplexer and at least one latch means associated therewith for holding electronic input signals representing control information, and (3) a plurality of means for producing optical output signals from the network from such electronic output signals; and optical means for routing optical output signals produced by the cross connection network.

18. A hybrid optical/electronic cross connection apparatus, comprising:

means for providing a plurality of distinct optical input signals;

a plurality of first fiber optic interconnects for routing the optical digital input signals, with at least one of the optical input signals being fanned-out via at least two distinct optic fiber interconnects for transmission to a plurality of distinct locations; and a cross connection array including (1) a plurality of first detector means, each at a distinct location, for detecting optical input signals and producing electronic input signals, (2) means for electrically performing digital logic operations on the electronic input signals within the cross connection array and producing therefrom electrical output signals, and (3) a plurality of means for producing optical output signals from the electrical output signals.

19. A cross connection apparatus as in claim 18, further comprising:

a plurality of means for detecting the optical output signals; and a plurality of second fiber optic interconnects between a plurality of means for producing optical output signals and the plurality of means for detecting the optical output signals.

20. A cross connection apparatus as in claim 19, wherein at least two of the second fiber optic interconnects are fanned in to a single means for detecting optical output signals.

21. A cross connection apparatus as in claim 18, wherein at least two of the first fiber optic interconnects are fanned in to a common first detector means.

* * * * *